(12) United States Patent
Kikuchi et al.

(10) Patent No.: US 10,096,654 B2
(45) Date of Patent: Oct. 9, 2018

(54) THREE-DIMENSIONAL RESISTIVE RANDOM ACCESS MEMORY CONTAINING SELF-ALIGNED MEMORY ELEMENTS

(71) Applicant: SanDisk 3D LLC, Milpitas, CA (US)

(72) Inventors: Shin Kikuchi, Yokkaichi (JP); Kazushi Komeda, Yokkaichi (JP); Takuya Futase, Yokkaichi (JP); Teruyuki Mine, Yokkaichi (JP); Seje Takaki, Yokkaichi (JP); Eiji Hayashi, Yokkaichi (JP); Toshihide Tobitsuka, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 184 days.

(21) Appl. No.: 14/851,296

(22) Filed: Sep. 11, 2015

(65) Prior Publication Data

US 2017/0077184 A1 Mar. 16, 2017

(51) Int. Cl.
*H01L 27/24* (2006.01)
*H01L 45/00* (2006.01)

(52) U.S. Cl.
CPC ........ *H01L 27/2481* (2013.01); *H01L 27/249* (2013.01); *H01L 27/2436* (2013.01);
(Continued)

(58) Field of Classification Search
CPC ............... H01L 27/2481; H01L 27/249; H01L 27/2454; H01L 45/1233; H01L 45/1266; H01L 45/146; H01L 45/145
See application file for complete search history.

(56) References Cited

U.S. PATENT DOCUMENTS 5,915,167 A 6/1999 Leedy
8,445,318 B2 5/2013 Shin
(Continued)

FOREIGN PATENT DOCUMENTS

JP 2008-182227 A 8/2008
WO WO 2007/004843 A1 1/2007

OTHER PUBLICATIONS

U.S. Appl. No. 14/206,196, filed Mar. 12, 2014, SanDisk 3D LLC.
(Continued)

*Primary Examiner* — William F Kraig
*Assistant Examiner* — Sun M King
(74) *Attorney, Agent, or Firm* — The Marbury Law Group PLLC

(57) ABSTRACT

An alternating material stack of insulator lines and first electrically conductive material layers is formed over a substrate, and is patterned to provide alternating stacks of insulating layers and first electrically conductive lines. A metal can be selectively deposited on the physically exposed sidewalls of the first electrically conductive material layers to form metal lines, while not growing from the surfaces of the insulator lines. The metal lines are oxidized to form metal oxide lines that are self-aligned to the sidewalls of the first electrically conductive lines. Vertically extending second electrically conductive lines can be formed as a two-dimensional array of generally pillar-shaped structures between the alternating stacks of the insulator lines and the first electrically conductive lines. Each portion of the metal oxide lines at junctions of first and second electrically conductive lines constitute a resistive memory element for a resistive random access memory (ReRAM) device.

16 Claims, 12 Drawing Sheets

(52) U.S. Cl.
CPC .......... *H01L 27/2454* (2013.01); *H01L 45/08* (2013.01); *H01L 45/1226* (2013.01); *H01L 45/1233* (2013.01); *H01L 45/146* (2013.01); *H01L 45/16* (2013.01); *H01L 45/1616* (2013.01); *H01L 45/1633* (2013.01)

(56) References Cited

U.S. PATENT DOCUMENTS

| | | | | |
|---|---|---|---|---|
| 8,710,484 | B2* | 4/2014 | Wei | H01L 45/08 257/4 |
| 2008/0073635 | A1* | 3/2008 | Kiyotoshi | H01L 27/105 257/2 |
| 2008/0210924 | A1 | 9/2008 | Shin | |
| 2010/0219392 | A1 | 9/2010 | Awaya et al. | |
| 2011/0175050 | A1* | 7/2011 | Chien | H01L 45/1253 257/4 |
| 2011/0212568 | A1 | 9/2011 | Shin | |
| 2013/0043455 | A1 | 2/2013 | Bateman | |
| 2013/0200326 | A1 | 8/2013 | Ju et al. | |
| 2013/0248801 | A1* | 9/2013 | Yamamoto | H01L 27/249 257/4 |
| 2015/0179659 | A1 | 6/2015 | Takaki | |
| 2015/0194380 | A1 | 7/2015 | Takaki et al. | |
| 2015/0255512 | A1 | 9/2015 | Takagi et al. | |

OTHER PUBLICATIONS

U.S. Appl. No. 14/224,290, filed Mar. 25, 2014, SanDisk 3D LLC.
U.S. Appl. No. 14/451,664, filed Aug. 5, 2014, SanDisk 3D LLC.
U.S. Appl. No. 14/463,113, filed Aug. 19, 2014, SanDisk 3D LLC.
U.S. Appl. No. 14/529,624, filed Oct. 31, 2014, SanDisk 3D LLC.
U.S. Appl. No. 14/564,526, filed Dec. 9, 2014, SanDisk Technologies Inc.
U.S. Appl. No. 14/614,709, filed Feb. 5, 2015, SanDisk Technologies Inc.
U.S. Appl. No. 14/623,843, filed Feb. 17, 2015, SanDisk 3D LLC.
U.S. Appl. No. 14/635,419, filed Mar. 2, 2015, SanDisk 3D LLC.
International Search Report and Written Opinion of the International Search Authority for International Application No. PCT/US2016/036757, dated Sep. 9, 2016, 11 pages.
International Preliminary Report on Patentability and Written Opinion of the International Searching Authority for International Application No. PCT/US2016/036757, dated Mar. 22, 2018, 8 pages.

* cited by examiner

THREE-DIMENSIONAL RESISTIVE RANDOM ACCESS MEMORY CONTAINING SELF-ALIGNED MEMORY ELEMENTS

FIELD

The present disclosure relates generally to the field of semiconductor devices and specifically to three-dimensional non-volatile memory devices, such as a three-dimensional resistive random access memory (ReRAM) devices and other three-dimensional devices, and methods of making the same.

BACKGROUND

Demand for greater computing capabilities especially in mobile computing has created a need for developing new technology for non-volatile memory devices having large memory capacity, high density, and low power consumption. Flash memory devices, while being the most common type of non-volatile memory devices, require relatively high operational voltage to write or erase data. As the gate length a conventional flash memory device scales down to tens of nanometers, adjacent memory cells may be parasitically operated during operation of a single memory cell, thus corrupting the integrity of data stored in memory cells. Such parasitic coupling between adjacent memory cells poses a serious challenge to further scaling of conventional flash memory devices.

Resistance Random Access Memory, or "ReRAM," is a non-volatile memory device employing reversible change in resistance in a thin film with application of electrical voltage bias across the film. Application of the electrical voltage bias in one manner can cause decrease in the resistance of the thin film, for example, by formation of filaments that function as leakage current paths. Application of a different type of electrical voltage bias can cause reversal of the resistance of the thin film to an original high-resistance state by removal of the filaments from the thin film. Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

SUMMARY

According to an aspect of the present disclosure, a monolithic three-dimensional memory device is provided, which comprises a plurality of alternating stacks of insulator lines and first electrically conductive lines located over a substrate. Each of the insulator lines and the first electrically conductive lines extends along a first horizontal direction, and the alternating stacks are laterally spaced from one another along a second horizontal direction. The monolithic three-dimensional memory device further comprises vertically spaced sets of metal oxide lines, each metal oxide line being self-aligned to a sidewall of a respective first electrically conductive line and not physically contacting any other of the metal oxide lines; and a plurality of second electrically conductive lines extending vertically and contacting one or more vertically spaced sets of metal oxide lines.

According to another aspect of the present disclosure, a method of fabricating a memory device is provided. A plurality of alternating stacks of insulator lines and first electrically conductive lines is formed over a substrate. Each of the insulator lines and the first electrically conductive lines extends along a first horizontal direction, and the alternating stacks are laterally spaced from one another along a second horizontal direction. Vertically spaced sets of metal lines are formed by depositing a metal on physically exposed surfaces of the first electrically conductive lines in the alternating stacks. The vertically spaced sets of metal lines are converted into vertically spaced sets of metal oxide lines by oxidation. Each vertically spaced set of metal oxide lines is located on a respective alternating stack. A plurality of second electrically conductive lines is formed on the vertically spaced sets of metal oxide lines.

DETAILED DESCRIPTION

As discussed above, the present disclosure is directed to a three-dimensional resistive random access memory (ReRAM) devices and other three-dimensional devices, and methods of making the same, the various aspects of which are described below. The embodiments of the disclosure can be employed to form various semiconductor devices such as three-dimensional monolithic memory array devices comprising ReRAM devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

Figure 1A:
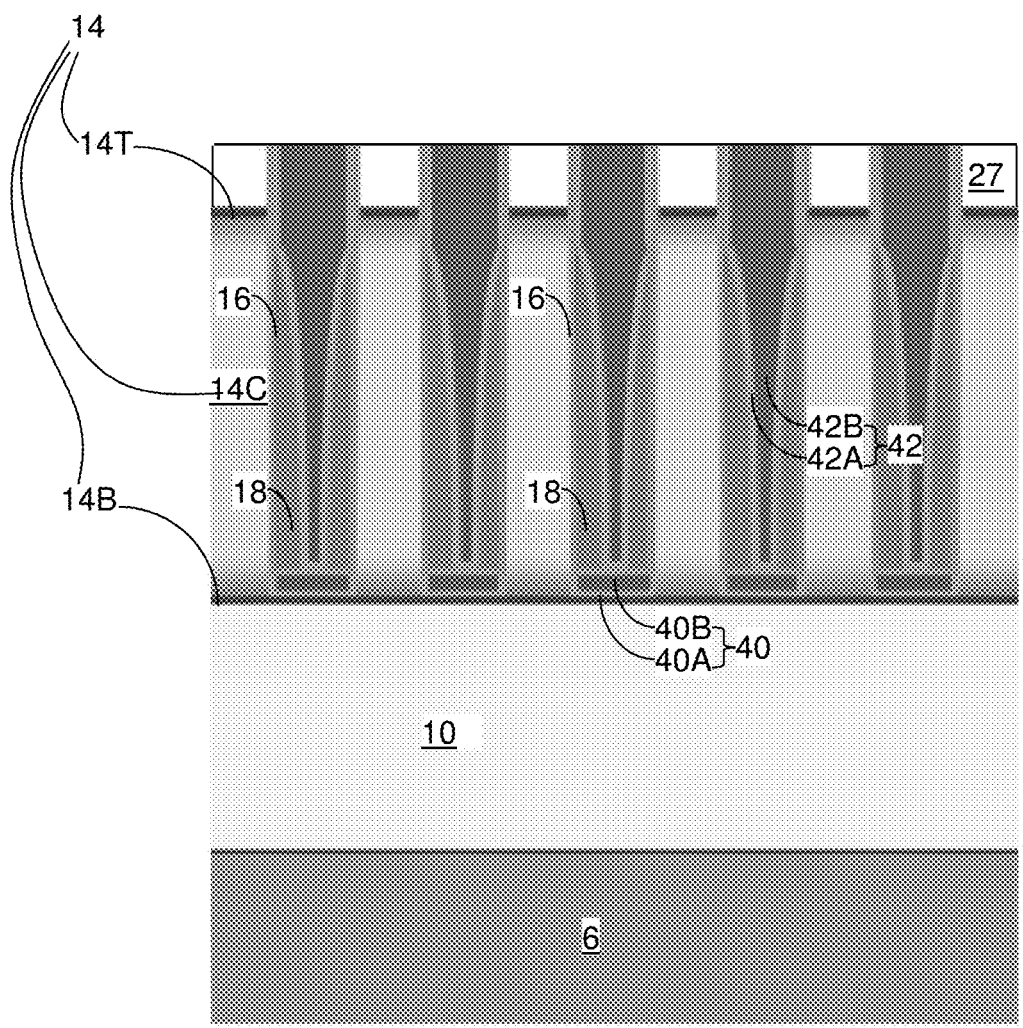
FIG. 1A is a vertical cross-sectional view of an exemplary structure after formation of bit line access transistors and dielectric fill layers according to an embodiment of the present disclosure.
Figure 1B:
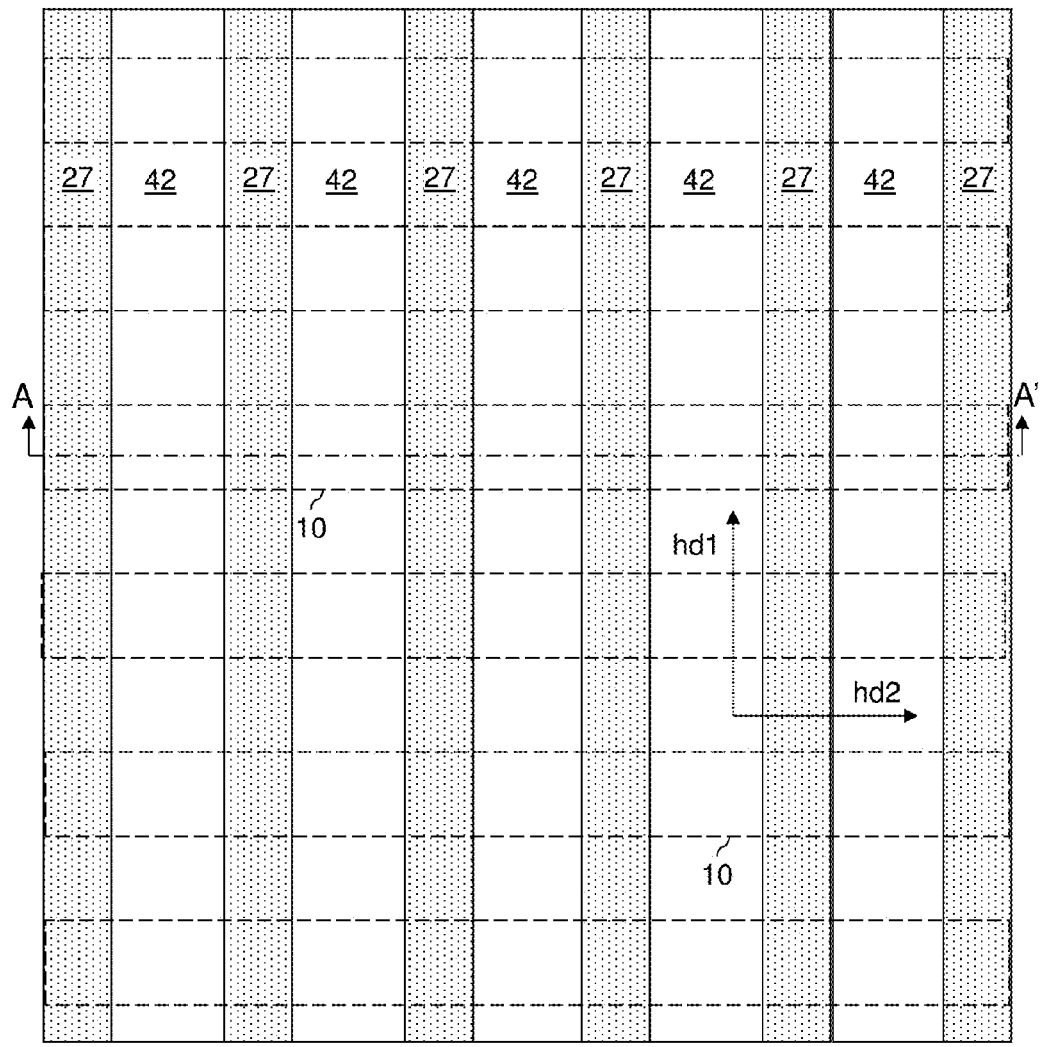
FIG. 1B is a see-through top-down view of the exemplary structure of FIG. 1A. The vertical plane A-A' is the plane of the cross-section for FIG. 1A.

The various three dimensional memory devices of the present disclosure can include a ReRAM device, and can be fabricated employing the various embodiments described herein. Referring to FIGS. 1A and 1B, an exemplary structure is illustrated, which can be an in-process ReRAM device. As used herein, a "prototype" structure or an "in-process" structure refers to a transient structure that is subsequently modified in the shape or composition of at least one component therein.

The exemplary structure includes a substrate 6, which includes an insulating layer at an upper portion thereof. In one embodiment, the substrate 6 can be a stack of at least two material layers such as a stack of an underlying substrate material layer and an overlying substrate insulator line. The substrate material layer can be a semiconductor material layer, a conductive material layer, or an insulator material layer that can provide structural support to the overlying structures, and may have a thickness greater than 50 microns, and typically in a range between 300 microns and 3 mm In one embodiment, the substrate material layer can be a semiconductor wafer, such as a silicon wafer as known in the art. The substrate insulator line can include an insulator material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense amplifiers, input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. A "semiconducting material" refers to a material having electrical conductivity in a range from $1.0 \times 10^{-6}$ S/cm to $1.0 \times 10^{5}$ S/cm. All measurements for electrical conductivities are made at the standard condition.

Global bit lines 10 are formed over the substrate 6. The global bit lines 10 are parallel conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions (not shown). A one-dimensional array of the global bit lines 10 and the separator dielectric material portions can extend along the first horizontal direction hd1. Alternatively, the one-dimensional array of the global bit lines 10 and the separator dielectric material portions may be formed by depositing a dielectric material layer, forming trenches extending along the first horizontal direction hd1 and laterally spaced from one another along the second horizontal direction hd2, and filling the trenches with at least one conductive material to form the global bit lines 10 therein.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel. Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to access transistors.

The access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14C is a drain region). As used herein, an "active region" refers to a source region or a drain region.

A semiconductor layer stack (14T, 14C, 14B) is formed over the top surfaces of the global bit lines 10 and the separator dielectric material portions. The semiconductor layer stack includes a first doped semiconductor layer, a channel material layer including a semiconductor material, and a second doped semiconductor layer having a same type of doping as the first doped semiconductor layer. Subsequently, an optional sacrificial material layer 27 (e.g., a sacrificial cap) can be formed on the top surface of the semiconductor layer stack. The sacrificial material layer can include, for example, organosilicate glass, a semiconductor material, or other sacrificial material that can be subsequently removed selective to the second doped semiconductor layer.

The sacrificial material layer and the semiconductor layer stack are subsequently patterned into a one-dimensional array of rail structures extending along the first horizontal direction hd1. The rail structures include patterned remaining portions of the sacrificial material layer and the semiconductor layer stack, and are laterally spaced apart by trenches that extend along the first horizontal direction hd1. The first horizontal direction hd1 can be perpendicular to the second horizontal direction hd2 along which the global bit lines 10 extend.

A spacer dielectric portion 40 can be formed at the bottom of each trench. Each spacer dielectric portion 40 can be formed over of the global bit lines 10 and the separator dielectric material portions such that the top surface of the spacer dielectric portion 40 is located at a target height for placing a bottom edge of gate electrodes 18 to be subsequently formed. For example, the top surface of the spacer dielectric portion 40 can be at a level about the interface between the remaining portions of the first doped semiconductor layer and the channel material layer. In one embodiment, each spacer dielectric portions 40 can include a vertical stack of a first spacer dielectric portion 40A and a second spacer dielectric portion 40B. The first spacer dielectric portion 40A can be deposited by a conformal deposition method, and the second spacer dielectric portion 40B can be deposited by a self-planarizing deposition method (such as spin coating). Portions of the first spacer dielectric portion 40A that protrudes above the top surface of the second spacer dielectric portion 40B can be removed, for example, by a selective etch that removes the material of the first spacer dielectric portion 40A selective to the material of the second spacer dielectric portion 40B. In one embodiment, the first spacer dielectric portion 40A can include silicon nitride, the second spacer dielectric portion 40B can include silicon oxide, and the selective etch can be a wet etch process that employs hot phosphoric acid.

The gate dielectrics 16 and the gate electrodes 18 of the access transistors can be subsequently formed, for example, by depositing a conformal gate dielectric layer (e.g., silicon oxide) and a conformal conductive material layer (e.g., heavily or degenerately doped polysilicon) in the trenches that separate the one-dimensional array of rail structures, and by anisotropically etching the conformal conductive material layer. The remaining vertical portions of the conformal conductive material layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the trenches are filled with at least one dielectric material. Excess portions of the at least one dielectric material can be removed from above the horizontal plane including the top surfaces of the rail structures (which include remaining portions of the semiconductor layer stack and the sacrificial material layer) by a planarization process, which can employ, for example, chemical mechanical planarization. Each remaining portion of the deposited dielectric material in the trenches constitutes a dielectric rail structure 42.

Each dielectric rail structure 42 extends along the first horizontal direction hd1 parallel to the rail structures that include the remaining portions of the semiconductor layer stack and the sacrificial material layer. Each dielectric rail structure 42 can have a tapered bottom portion in which the width of the dielectric rail structure 42 monotonically or strictly increases as a function of a vertical distance from the substrate 6. In one embodiment, each dielectric rail structure 42 can include a dielectric liner 42A and a dielectric rail fill portion 42B. In one embodiment, the dielectric liners 42A can include silicon nitride, and the dielectric rail fill portions 42B can include silicon oxide.

As seen from above, dielectric rail structures 42 and the rail structures (including remaining portions of the semiconductor layer stack (14T, 14C, 14B) and the sacrificial material layer 27) alternate along the second horizontal direction hd2 after formation of the dielectric rail structures 42.

Subsequently, a photoresist layer can be applied over the exemplary structure, and can be lithographically patterned to cover regions that overlie the global bit lines 10. In other words, openings are formed in areas between the areas of the global bit lines 10. In one embodiment, the photoresist layer can be patterned with the same pattern as the pattern of the one-dimensional array of the global bit lines 10 such that openings in the photoresist layer extend along the second horizontal direction hd2. Employing the combination of the photoresist layer and optionally the dielectric rail structures 42 as an etch mask, physically exposed portions of the rail structures (including remaining portions of the semiconductor layer stack and the sacrificial material layer) can be etched to form a two-dimensional array of pillar structures. Alternatively, the dielectric rail structures 42 are not used as a mask, and portions of the dielectric rail structures 42 that are not masked by the photoresist are etched together with the remaining portions of the semiconductor layer stack and the sacrificial material layer.

Each remaining portion of the sacrificial material layer constitutes a sacrificial material portion, and each remaining portion of the semiconductor layer stack constitutes a semiconductor pillar 14. Each pillar structure includes a vertical stack of a semiconductor pillar 14 and a sacrificial material 27 portion. Each semiconductor pillar 14 includes a bottom active region 14B (which is a remaining portion of the first doped semiconductor layer), a semiconductor channel 14C (which is a remaining portion of the channel material layer), and a top active region 14T (which is a remaining portion of the second doped semiconductor layer).

Within each semiconductor pillar 14, one of the bottom active region 14B and the top active region 14T is a source region, and the other of the bottom active region 14B and the top active region 14T is a drain region. The cross-sectional shape of each semiconductor pillar 14 can be substantially invariant throughout the entirety of the semiconductor pillar 14. Further, each overlying sacrificial material portion 27 can have substantially the same horizontal cross-sectional shape as the horizontal cross-sectional shape of the underlying semiconductor pillar 14.

The photoresist layer can be removed, for example, by ashing. The two-dimensional array of cavities that separate the pillar structures along the first horizontal direction hd1 can be filled with a dielectric fill material, which can include, for example, silicon oxide, organosilicate glass, and/or silicon nitride. The dielectric fill material can be removed from above the top surfaces of the dielectric rail structures 42, for example, by chemical mechanical planarization. Each remaining portions of the dielectric fill material constitutes a dielectric fill material portion 37 located between the semiconductor pillars 14 in the hd1 direction.

Figure 2A:
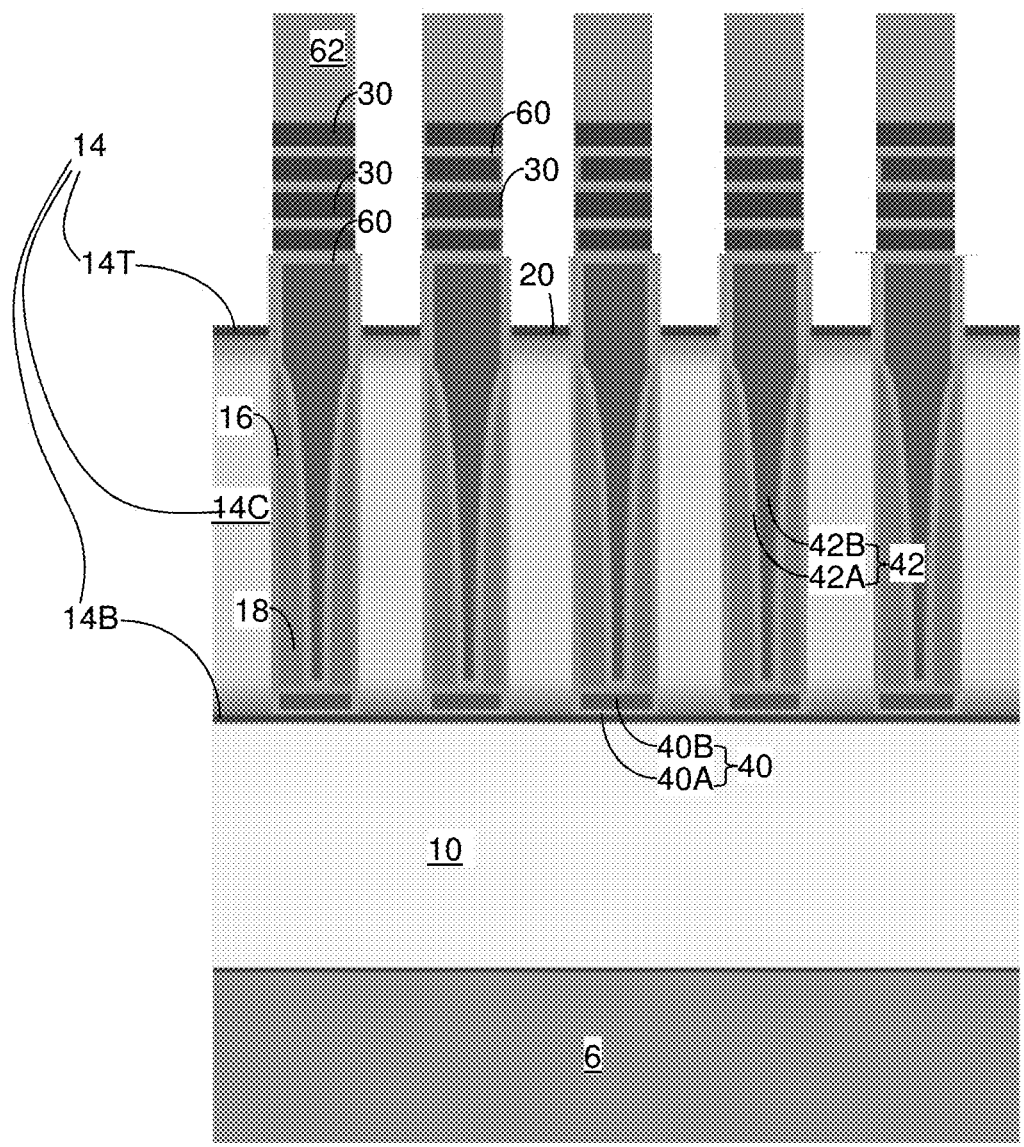
FIG. 2A is a vertical cross-sectional view of the exemplary structure after formation of alternating stacks of insulator lines and first conductive material lines according to an embodiment of the present disclosure.
Figure 2B:
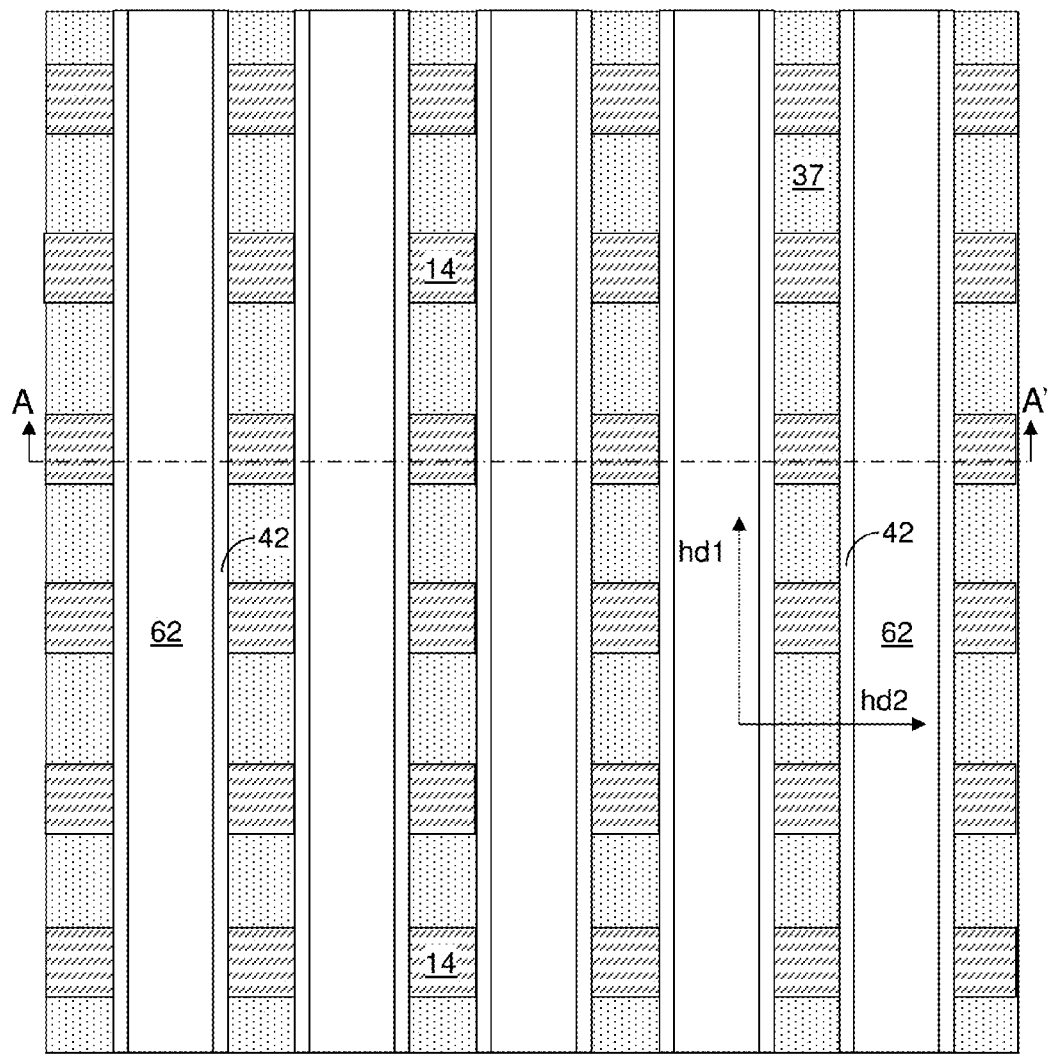
FIG. 2B is a top-down view of the exemplary structure of FIG. 2A. The vertical plane A-A' is the plane of the cross-section for FIG. 2A.

Referring to FIGS. 2A and 2B, an alternating stack of electrically conductive layers and insulator layers are formed over the one dimensional array of the dielectric rail structures 42 and the dielectric fill material portions as stacks of blanket (unpatterned) layers. A contiguous insulator cap portion can be formed over the alternating stack of the electrically conductive layers and the insulator layers.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulator layers may begin with an instance of the electrically conductive layers or with an instance of the insulator layers, and may terminate with an instance of the electrically conductive layers or with an instance of the insulator layers. In one embodiment, an instance of the first elements and an instance of the second elements may form a unit that is repeated with periodicity within the alternating plurality.

Subsequently, the contiguous insulator cap portion and the alternating stack of the electrically conductive layers and the insulator layers are patterned to form line stack rail structures. Each line stack rail structure overlies a dielectric rail structure 42, extends along the first horizontal direction hd1, and is laterally spaced apart from one other line stack rail structures along the second horizontal direction hd2. Each patterned portion of the contiguous insulator cap portion is herein referred to as an insulator cap portion 62. Each patterned portion of the electrically conductive layers is herein referred to as a first electrically conductive line 30 (e.g., word line). Each patterned portion of the insulator layer is herein referred to as an insulator line. Thus, each line stack rail structure (30, 60, 62) includes an alternating stack of first electrically conductive lines 30 and insulator lines 60 and an insulator cap portion 62. In one embodiment, each line stack rail structure (30, 60, 62) can have a lesser width along the second horizontal direction hd2 than the underlying dielectric rail structure 42, and can be entirety within the area of the underlying dielectric rail structure 42.

In one embodiment, the electrically conductive layers, and hence the first electrically conductive lines 30, comprise a first electrically conductive material. In one embodiment, the first electrically conductive material can be a conductive metal nitride. In one embodiment, the first electrically conductive material can be selected from titanium nitride, tantalum nitride, titanium oxynitride in which a ratio of oxygen atoms to nitrogen atoms is less than 0.1, and tantalum oxynitride in which a ratio of oxygen atoms to nitrogen atoms is less than 0.1. Alternatively, lines 30 may comprise a metal having a work function lower than 4.5 rather instead of or in addition to a metal nitride. The insulator lines 60 and the insulator cap portion 62 may comprise any suitable insulating material, such as silicon oxide.

The thickness of the first electrically conductive lines 30 can be in a range from 5 nm to 60 nm, although lesser and greater thicknesses can also be employed. The thickness of the insulating lines 60 can be in a range from 5 nm to 60 nm, although lesser and greater thicknesses can also be employed. The thickness of the insulator cap portions 62 can be in a range from 5 nm to 300 nm, although lesser and greater thicknesses can also be employed.

A pair of a first electrically conductive line 30 and an insulator line 60 can constitute a unit of repetition in the alternating stack (30, 60) of the first electrically conductive lines 30 and the insulator lines 60. The total number of repetitions can be in a range from 8 to 1,024, although lesser and greater number of repetitions can also be employed. Thus, a plurality of alternating stacks (30, 60) of insulator lines 60 and first electrically conductive lines 30 is formed over a substrate 6. Each of the insulator lines 60 and the first electrically conductive lines 30 extends along the first horizontal direction (i.e., the word line direction) hd1. The alternating stacks (30, 60) are laterally spaced from one another along the second horizontal direction hd2 (i.e., the global bit line direction).

Subsequently, top regions of the dielectric fill material portions 27 can be removed from above the top surfaces of the semiconductor pillars 14, for example, by an isotropic etch or an anisotropic etch. The isotropic or anisotropic etch can recess the dielectric fill material portions 27 at least until the top surfaces of the semiconductor pillars 14 are physically exposed. In an illustrative example, if the dielectric fill material portions 27 include organosilicate glass, a wet etch employing dilute hydrofluoric acid can be employed.

Figure 3A:
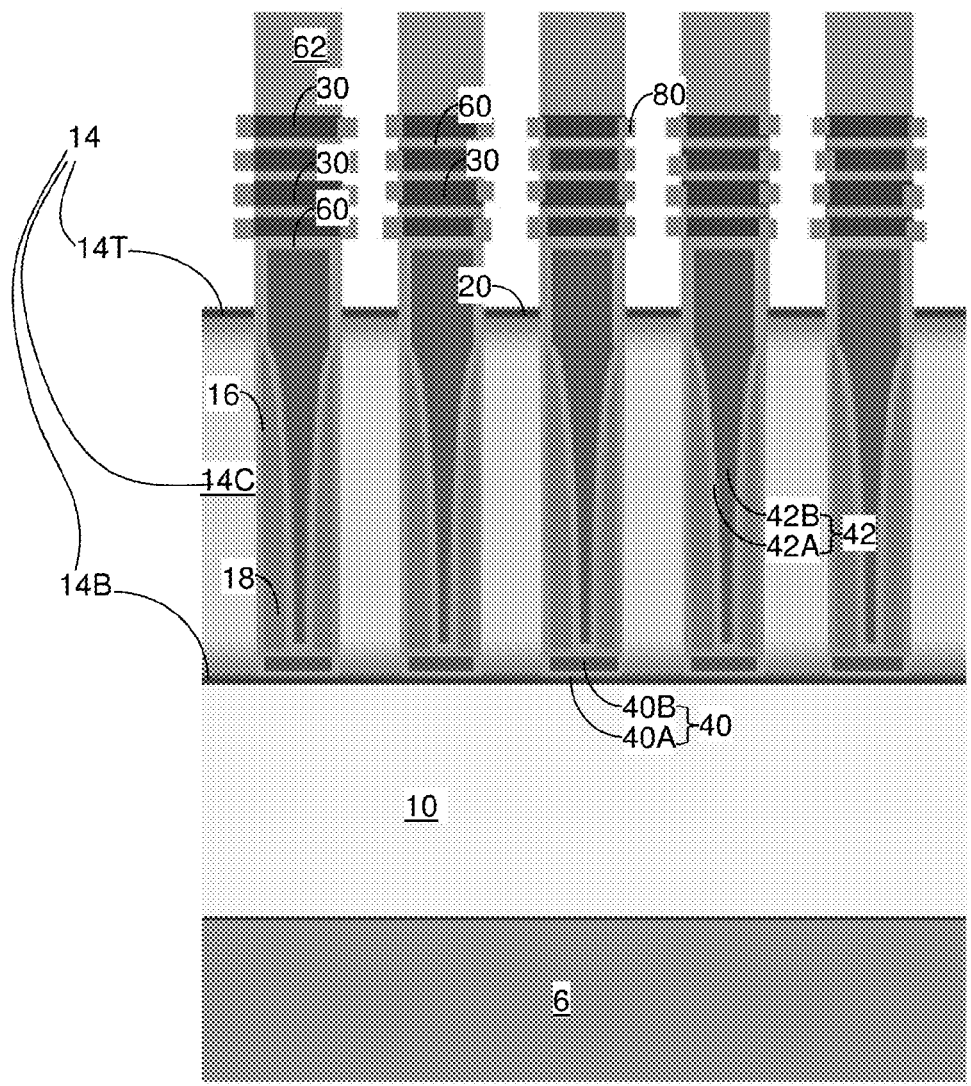
FIG. 3A is a vertical cross-sectional view of the exemplary structure after selective deposition of metal lines according to an embodiment of the present disclosure.
Figure 3B:
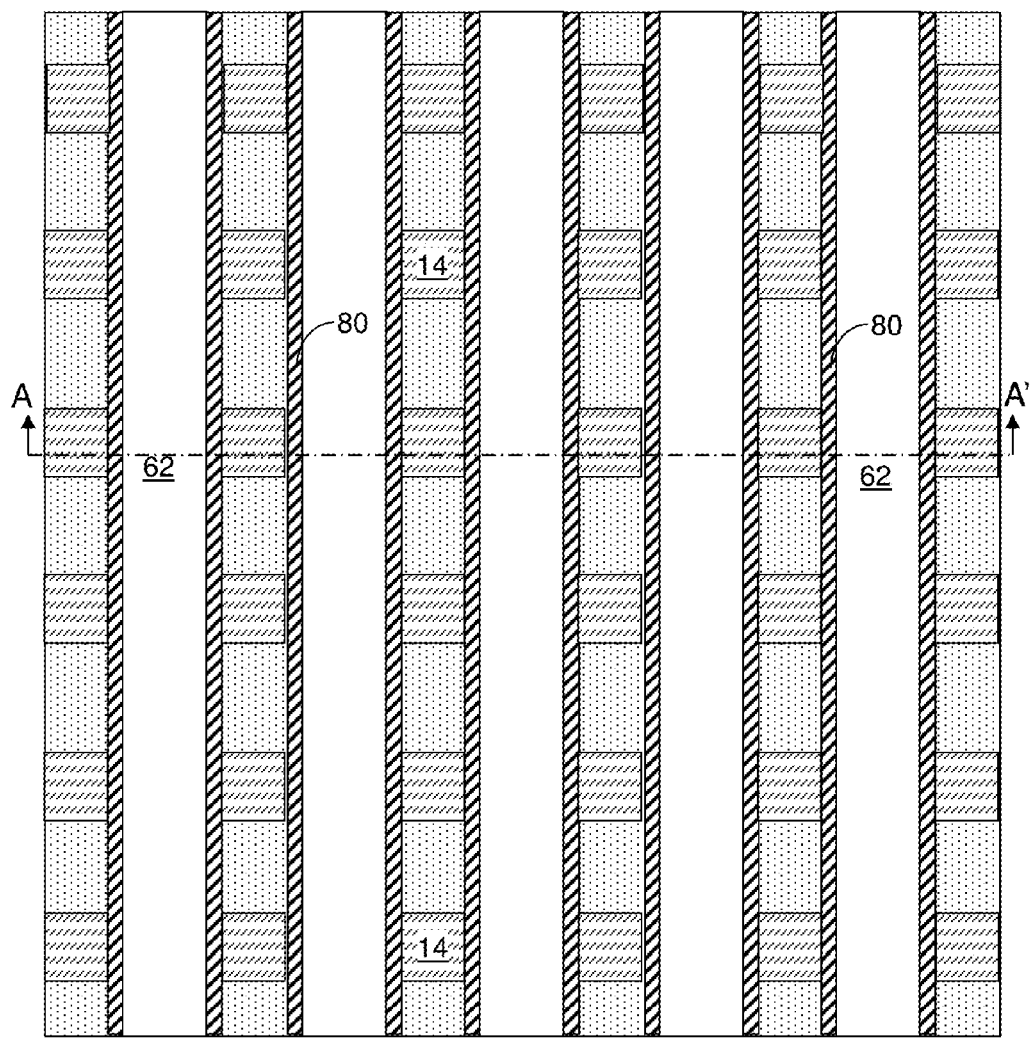
FIG. 3B is a top-down view of the exemplary structure of FIG. 3A. The vertical plane A-A' is the plane of the cross-section for FIG. 3A.

Referring to FIGS. 3A and 3B, an optional surface clean process can be performed to remove impurity materials from the physically exposed sidewalls of the first electrically conductive lines 30. For example, dilute hydrofluoric acid can be employed to preclean the surfaces of the first electrically conductive lines 30. The effect of the preclean is to facilitate selective growth of a metal in a subsequent selective metal deposition step.

Selective growth of metal in the elemental metal form is performed on the physically exposed sidewalls of the first electrically conductive lines 30. Atomic layer deposition (ALD) process can be employed to provide growth of metal only on metallic surfaces of the first electrically conductive lines 30, while suppressing growth of metal from dielectric surfaces (e.g., from sidewalls of the insulator lines 60) and semiconductor surfaces (e.g., from semiconductor pillar 14 region 14T top surface).

During the selective ALD deposition of metal, the exemplary structure of FIGS. 2A and 2B can be placed in a process chamber, which is subsequently pumped down to a base pressure lower than 1 mTorr, and preferably lower than $1.0 \times 10^{-6}$ Torr. A metal precursor gas can be supplied into the process chamber as a first process gas for a first time duration, which can be 0.1 to 1 seconds, such as about 0.5 second, and is discharged thereafter by being pumped out. In one embodiment, the metal precursor gas can be a metal chloride gas such as $HfCl_4$, $TiCl_4$, $ZrCl_4$, $AlCl_3$, and $TaCl_5$.

Next, a second process gas of $NH_3$ is supplied into the process chamber for a second time duration, which can be 0.1 to 1 seconds, such as about 0.5 second, and is discharged thereafter by being pumped out. The flowing and subsequent pump-out of the first and second process gases constitutes one cycle of the ALD process. Multiple cycles of the ALD process are performed until a metal is selectively deposited on the sidewalls of the first electrically conductive lines 30 to a target deposition thickness. The metal which is selectively grown on one line 30 may extend slightly beyond the upper and lower horizontal surfaces of the line 30 in the horizontal direction due to slight non-uniformities of selective growth, but preferably does not touch the metal grown on the vertically adjacent line 30. Incremental increase in the thickness of each metal portion per cycle is about 0.1 nm. In an illustrative example, in order to deposit metal portions having a thickness of about 2 nm, about 20 cycles of the ALD process can be employed.

The process gases of the ALD process do not include oxygen atoms in order to avoid oxidation of the metallic material of the first electrically conductive layers 30 or the deposited metal. This is because formation of an oxidized surface inhibits further deposition of the metal thereupon.

During the ALD process, the physically exposed surfaces of the semiconductor pillars 14 are semiconductor surfaces (such as polysilicon surfaces). Further, the physically exposed surfaces of the dielectric rail structures 42, the insulator lines 60, and the insulator cap portions 62 are dielectric surfaces. Thus, physically exposed metallic surfaces (which may be surfaces of conductive metal nitride) are present only on the sidewalls of the first electrically conductive lines 30 within the trenches that separate the line stack rail structures (30, 60, 62) during the ALD process. During an ALD process, a nucleation rate on a metallic surface (such as a surface of a metallic nitride or an elemental metal) is greater compared to nucleation rate on dielectric surfaces or semiconductor surfaces (such as surfaces of $SiO_2$ or Si). The first time duration (e.g., the time period during which the first process gas of $HfCl_4$ is supplied into the process chamber) is selected to be less than the nucleation time for nucleating a metal on the dielectric surfaces or semiconductor surfaces and greater than the nucleation time on the metallic surfaces of the first electrically conductive lines 30. In this case, the nucleation of the metal can occur only on the metallic surfaces and not on the dielectric surfaces or semiconductor surfaces, thereby providing selective growth of the metal.

The metal precursor gas includes a metal element of which an oxide can provide a non-volatile read-write (i.e., memory) element through which reversible formation of conductive filaments occurs. Such metal elements include, but are not limited to, Hf, Ti, Zr, Al, and Ta. The metal oxides of such metals are reversibly resistance-switching materials, or "resistive memory materials." In a configuration in which a reversibly resistance-switching material is disposed between a first electrode (e.g., word line) and a second electrode (e.g., vertical bit line), conductive filaments can be formed within the reversibly resistance-switching material by application of an electrical bias, and can be removed from the reversibly resistance-switching material by application of a reverse electrical bias. In a non-limiting illustrative example, the first electrode can be made of titanium nitride (or any material that can be employed as the first electrically conductive material of the first electrically conductive lines 30), and the second electrode can be made of platinum or n-doped polysilicon (or any material that can be employed as a second electrically conductive material of second electrically conductive lines to be subsequently formed). The device of the present disclosure is not restricted to any one set of materials for forming the non-volatile memory elements.

Metal oxides are characterized by being insulating when initially deposited. A metal oxide can be formed with oxygen deficiencies (e.g., vacancies), or can be annealed to form oxygen deficiencies. The second electrode can include a high work function material having a work function greater than 4.5 eV, and can be employed to provide a high potential barrier for electrons at the interface with the reversibly resistance-switching material. As a result, at moderate voltages (below one volt), a very low current will flow through the reversibly resistance-switching material. The energy barrier at the interface between the second electrode and the reversibly resistance-switching material can be lowered by the presence of the oxygen vacancies ($O^{+2}$). In this case, the interface between the second electrode and the reversibly resistance-switching material can provide the characteristics of a low resistance contact (Ohmic contact). The oxygen vacancies in the metal oxide of the reversibly resistance-switching material function as n-type dopants, thereby transforming the originally insulating metal oxide into an electrically insulating material having a lower resistivity (but still insulating). The resulting composite structure is in a non-conductive (high resistance) state in the absence of conductive filaments therein.

When a large forward bias voltage (such as a negative voltage of about −1.5 volt that is applied to the second electrode with respect to the first electrode) is applied across the reversibly resistance-switching material, the oxygen vacancies drift toward the interface between the high energy barrier material (such as platinum or n-dope polysilicon) and the reversibly resistance-switching material, and as a result, the potential barrier at the interface between the second electrode and the reversibly resistance-switching material is reduced and a relatively high current can flow through the structure. The device is then in its low resistance (conductive) state in which the reversibly resistance-switching material functions as a semiconducting material or a conductive material. Without wishing to be bound by a particular theory, it is believed that conduction occurs by formation of conductive filaments having a high density of oxygen vacancies, which may occur along grain boundaries.

The conductive path can be broken by applying a large reverse bias voltage (such as a positive voltage of about 1.5 volt that is applied to the second electrode with respect to the first electrode) across the reversibly resistance-switching material. Under a suitable reverse bias condition, the oxygen vacancies move away from the proximity of the interface between the high work function material and the reversibly resistance-switching material, and "break" the conductive filament. The resistivity of the reversibly resistance-switching material returns to its high resistance state. Both of the conductive and non-conductive states are non-volatile. Sensing the conduction of the memory storage element (for example, by applying a voltage around 0.5 volts) can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials that be used for the non-volatile memory elements include hafnium oxide, such as $HfO_x$ where $1.9<x<2.1$. Suitable materials for the first electrode (e.g., word line) are any conducting material such as Ti(O)N, Ta(O)N, TiN and TaN. Suitable materials for the second electrode (e.g., local bit line) include metals and doped semiconductor with a high work function (typically >4.5 eV) capable to getter oxygen in contact with the metal oxide to create oxygen vacancies at the contact. Some examples are TaCN, TiCN, Ru, $RuO_2$, Pt, Ti rich $TiO_x$, TiAlN, TaAlN, TiSiN, TaSiN, $IrO_2$ and doped polysilicon. The thicknesses of the electrodes are typically 1 nm or greater. Thicknesses of the metal oxide are generally in the range of 2 nm to 20 nm.

The ALD process formed a vertically spaced set of metal lines 80 is formed on each alternating stack (30, 60). In other words, vertically spaced sets of metal lines 80 are formed by depositing the metal on physically exposed surfaces of the first electrically conductive lines 30 while preventing growth of the metal from surfaces of the insulator lines 60 and from the semiconductor surfaces of the semiconductor pillars 14. Each metal line 80 can be formed as a single contiguous structure that laterally surrounds, and contacts, a first electrically conductive line 30, while being spaced from (and therefore, not contacting) any other overlying or underlying metal lines 80. Thus, the metal lines 80 are spaced apart in the vertical direction along the alternating stack.

Figure 4A:
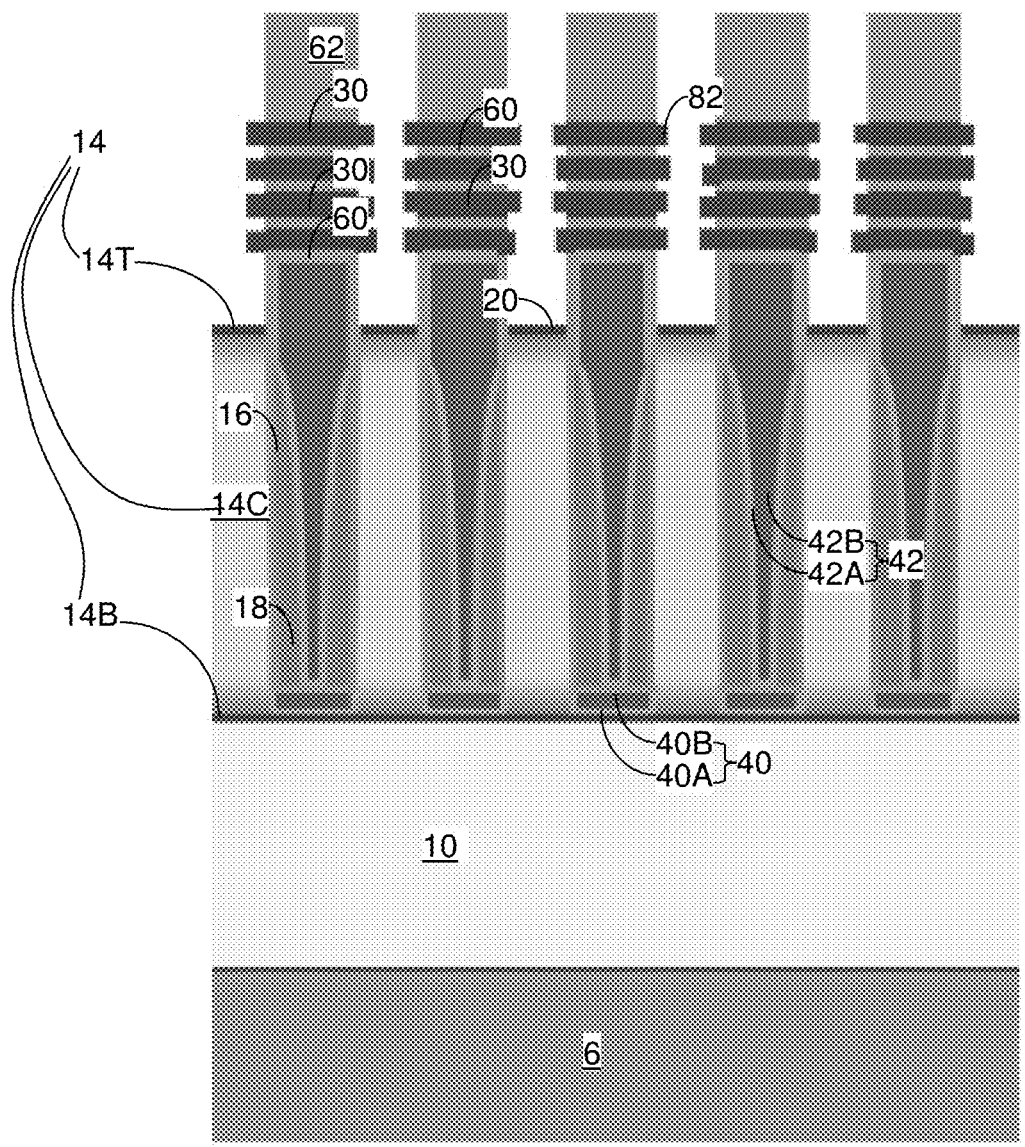
FIG. 4A is a vertical cross-sectional view of the exemplary structure after conversion of the metal lines into metal oxide lines according to an embodiment of the present disclosure.
Figure 4B:
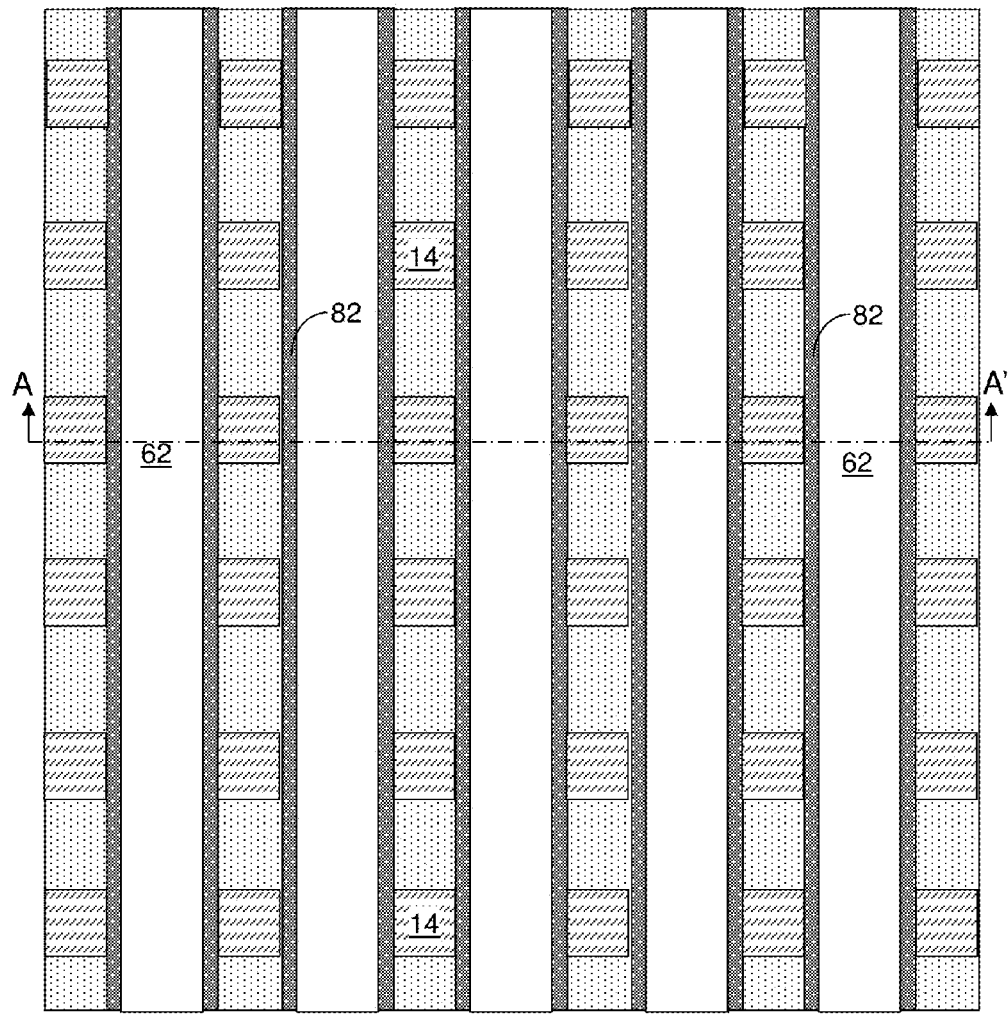
FIG. 4B is a top-down view of the exemplary structure of FIG. 4A. The vertical plane A-A' is the plane of the cross-section for FIG. 4A.

Referring to FIGS. 4A and 4B, the vertically spaced sets of metal lines 80 can be converted into vertically spaced sets of metal oxide lines 82 by oxidation. The oxidation process can be performed employing thermal oxidation or plasma oxidation. In case thermal oxidation is employed, an oxygen-containing gas such as $O_2$ or $H_2O$ can be supplied to the exemplary structure at an elevated temperature, which can be, for example, in a range from 600 degrees Celsius to 1,000 degrees Celsius. Each metal oxide line 82 contacts sidewalls of a respective first electrically conductive line 30. Each vertically spaced set of metal oxide lines 82 is formed on a respective alternating stack of first electrically conductive lines 30 and insulator lines 60. In one embodiment, each of the metal oxide lines 82 can contact only one first electrically conductive line 30 among the first electrically conductive lines 30. In one embodiment, each of the metal oxide lines 82 can be physically spaced from, i.e., free of direct physically contact with, any other of the metal oxide lines 82. Thus, the metal oxide lines 82 are spaced apart in the vertical direction along the alternating stack. Volume expansion can occur during the oxidation of the metal lines 82. For example, if each metal line 80 has a lateral thickness of about 2 nm, each metal oxide line 82 can have a lateral thickness of about 3 nm. Furthermore, the metal oxide lines 82 may protrude over and under the top and bottom surfaces of the adjacent word line 30 due to the expansions without contacting vertically adjacent lines 82.

Figure 5A:
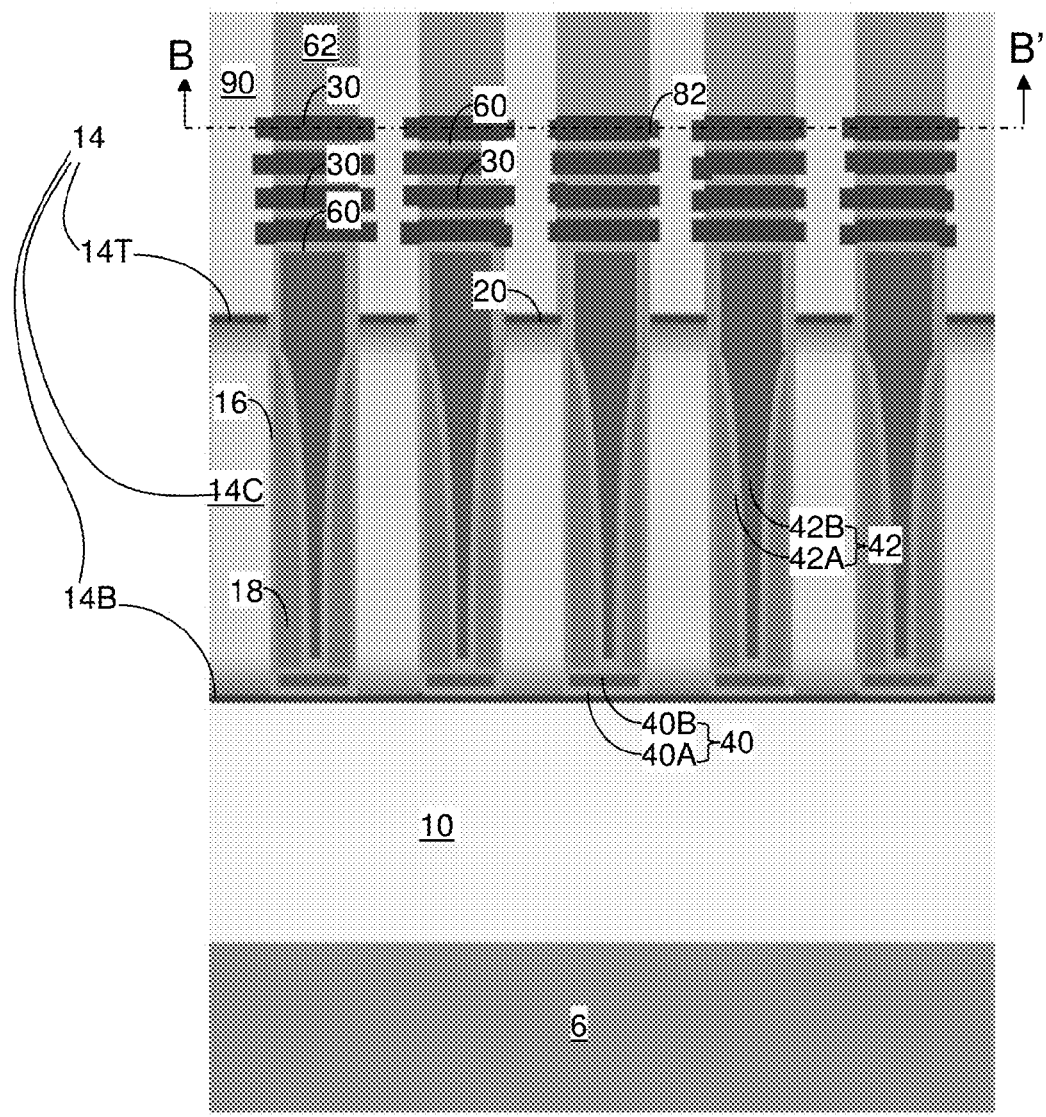
FIG. 5A is a vertical cross-sectional view of the exemplary structure after formation of second electrically conductive lines according to an embodiment of the present disclosure.
Figure 5B:
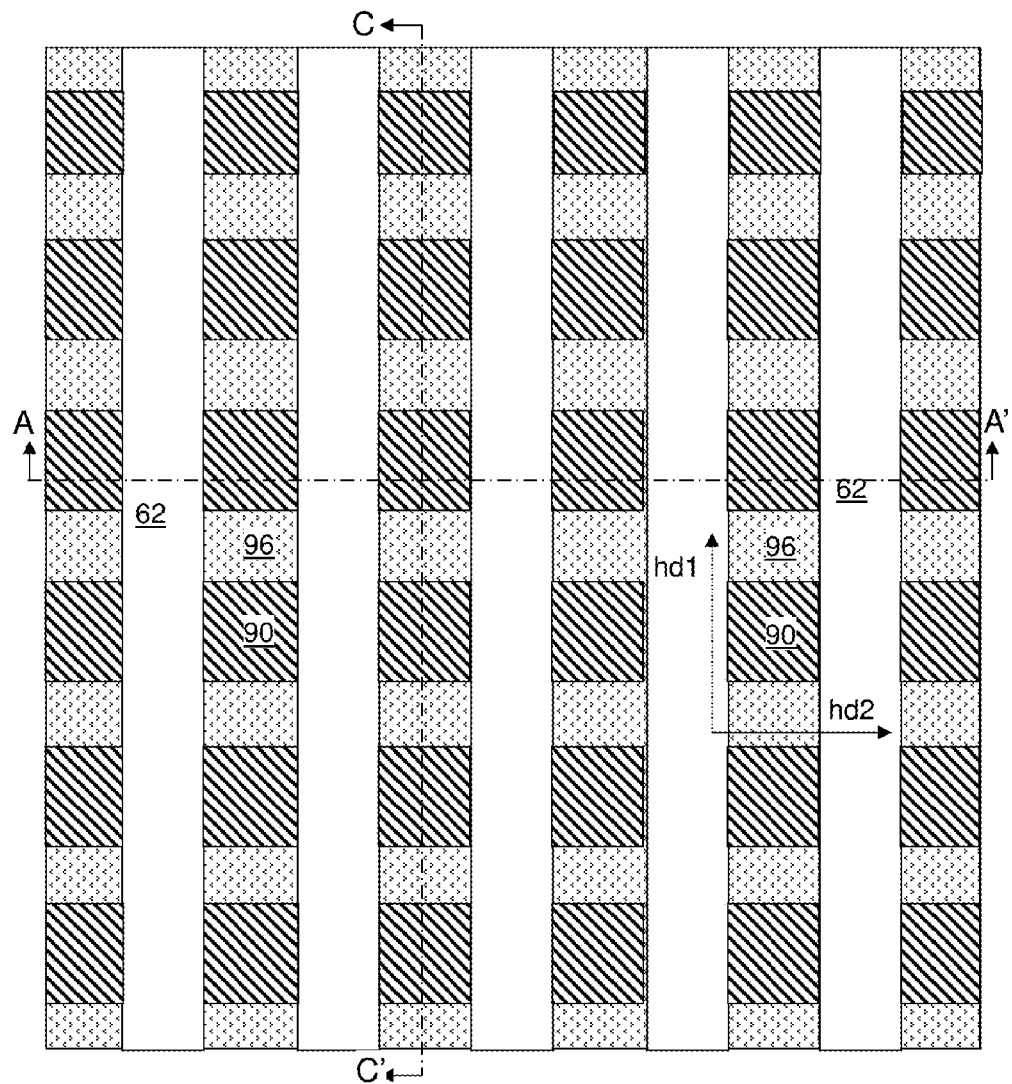
FIG. 5B is a top-down view of the exemplary structure of FIG. 5A. The vertical plane A-A' is the plane of the cross-section for FIG. 5A. The vertical plane C-C' is the plane of the cross-section for FIG. 5C.
Figure 5C:
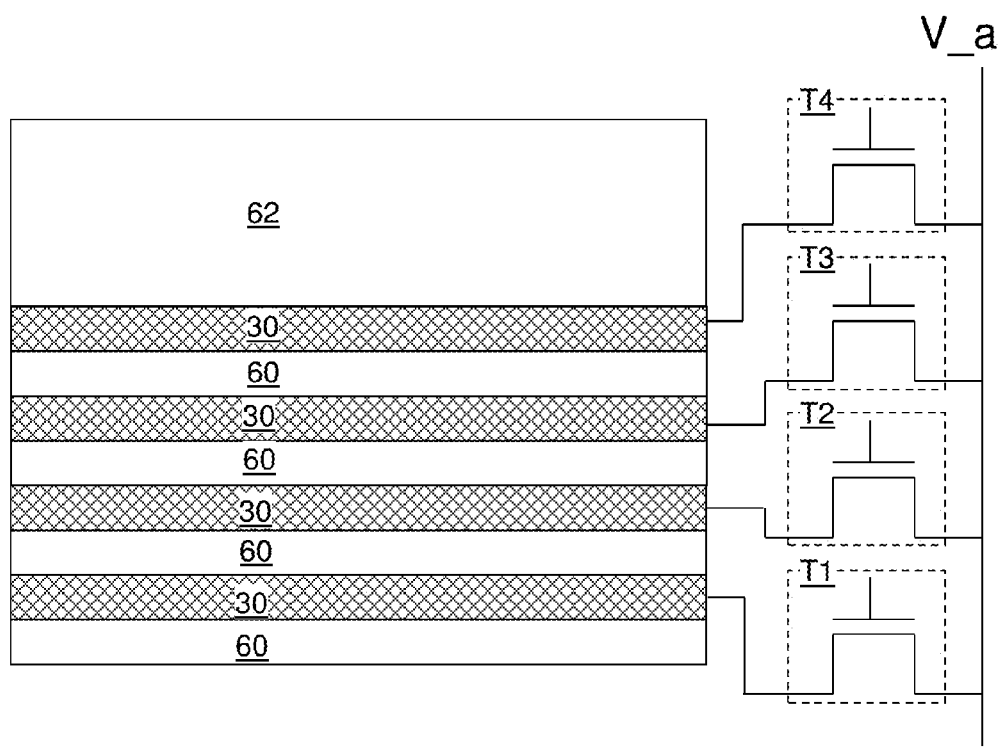
FIG. 5C is another vertical cross-sectional view of the exemplary structure of FIGS. 5A and 5B.

Referring to FIGS. 5A-5C, a laterally alternating stack of second electrically conductive lines 90 and dielectric pillar structures 96 is formed within each trench located between a neighboring pair of line stack rail structures (30, 60, 62).

In one embodiment, a second electrically conductive material can be deposited within the trenches among the line stack rail structures (30, 60, 62), for example, by a conformal deposition process. The second electrically conductive material is different from the first electrically conductive material. In one embodiment, the second electrically conductive material can be selected from TaCN, TiCN, Ru, $RuO_2$, Pt, $TiO_x$ with x in a range from 0 to 0.1, TiAlN, TaAlN, TiSiN, TaSiN, $IrO_2$, and doped polysilicon. In one embodiment, the second electrically conductive material has a work function greater than 4.5 eV.

Excess portions of the second electrically conductive material deposited over the horizontal plane including the top surfaces of the line stack rail structures (30, 60, 62) can be removed, for example, by chemical mechanical planarization. Thus, each remaining portion of the deposited second electrically conductive material can fill a trench between a neighboring pair of line stack rail structures (30, 60, 62). Each portion of the deposited second electrically conductive material can be divided into a plurality of second electrically conductive lines (e.g., local bit lines) that extend along the vertical direction, for example, by applying a photoresist layer over the top surfaces of the second electrically conductive material portions and the line stack rail structures (30, 60, 62), patterning the photoresist layer to form openings in areas that do not overlie the global bit lines 10, and removing the physically exposed portions of the second electrically conductive material employing a combination of the photoresist layer and the insulator cap portions 62 as an etch mask. Each remaining portion of the second electrically conductive material constitutes a second electrically conductive line 90, which can have a shape of a pillar structure. A plurality of second electrically conductive lines 90 is formed on the vertically spaced sets of metal oxide lines 82.

Each of the second electrically conductive lines 90 can be formed over an area of a respective vertical field effect transistor (14, 16, 18), which is herein referred to as a first select transistor. Each select transistor can electrically connect a global bit line 10 to a second electrically conductive line 90, or can electrically disconnect (i.e., provide an electrical open between) the global bit line 10 and the second electrically conducive line 90. A switched node of each first select transistor (i.e., a top active region 14T) is connected to an end of a respective second electrically conductive line 90.

Figure 6:
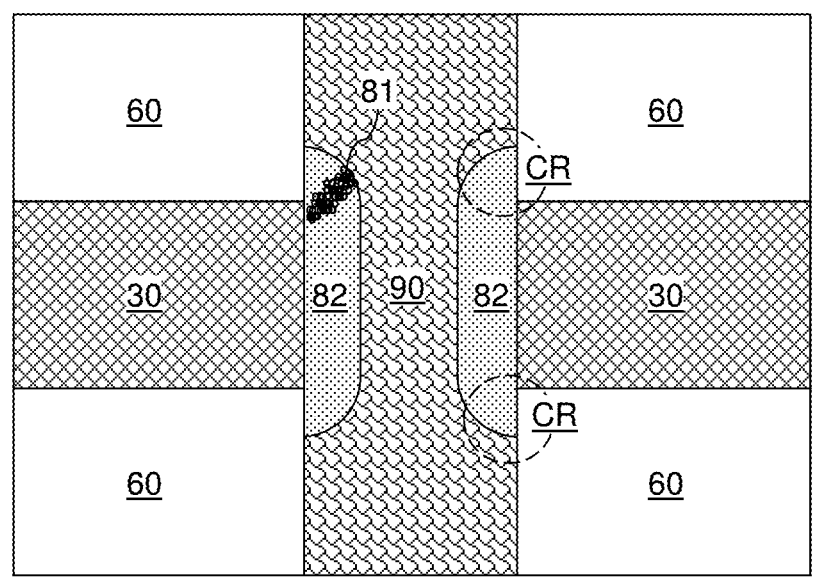
FIG. 6 is a vertical cross-sectional view of a portion of the exemplary device of the present disclosure for illustrating formation of a conductive filament.

Referring to FIG. 6, the mechanism of formation of conductive filaments 81 is illustrated. Each first electrically conductive line 30 functions as a first electrode (e.g., word line), each adjacent second electrically conductive line 90 functions as a second electrode (e.g., local bit line), and each portion of the metal oxide line 82 disposed between a pair of a first electrically conductive line 30 and a second electrically conductive line 90 functions as a reversibly resistance-switching material. The conductive filaments 81 can be formed in corner regions of each metal oxide line 82 due to the enhanced electrical field in the corner regions. This feature is due to the vertically limited spatial extent of the metal oxide lines 82 of the present disclosure, which is not present in prior art resistive memory devices in which the metal oxide reversibly resistance-switching material forms a continuous memory film in the vertical direction adjacent to the alternating stack (i.e., a film that spans two or more lines 30 in the vertical direction). The vertically limited spatial extent of the metal oxide lines 82 is due to the self-alignment of the metal-oxide lines 82 to the first electrically conductive lines 30 caused by the selective growth of the metal lines during the ALD process.

Each second electrically conductive line 90 can be formed as a generally pillar-shaped structure having a width modulation as a function of a distance from the substrate 6. The magnitude of the width modulation is twice the lateral thickness of the metal oxide lines 82. Specifically, the width modulation comprises a reduction of a width of each second electrically conductive line 90 at levels of the hafnium oxide lines 82, or the "necking" of each second electrically conductive line 90 between pairs of hafnium oxide lines 82 and an increase in the width adjacent to the insulator lines 60 in the alternating stack.

The second electrically conductive lines 90 form a two-dimensional array having the same periodicity as the array of vertical field effect transistors (14, 16, 18) (i.e., the first access transistors). The second electrically conductive lines 90 are spaced apart from one another by cavities along the first horizontal direction hd1, and by the line stack rail structures (30, 60, 62) along the second horizontal direction hd2.

A dielectric material (such as silicon oxide) can be deposited into the cavities. Excess portions of the dielectric material can be removed from above a horizontal plane including the top surfaces of the line stack rail structures (30, 60, 62) and the second electrically conductive lines 90, for example, by chemical mechanical planarization. Dielectric material pillars 96 are formed in each volume of the cavities, i.e., between the second electrically conductive lines 90 and between the line stack rail structures (30, 60, 62) (and therefore, between the alternating stacks (30, 60)). In this configuration, the second electrically conductive lines 90 are formed as a two-dimensional array in which the second electrically conductive lines 90 are spaced from one another by the dielectric material pillars 96 along the first horizontal direction hd1, and by the alternating stacks (30, 60) along the second horizontal direction hd2.

Referring back to FIG. 5C, second select transistors (T1-T4) (e.g., word line select transistors) for selectively activating a respective first electrically conductive line 30 (i.e., word line) can be formed at any suitable stage of the processing sequence. For example, the second select transistors can be formed in, or on, the substrate 6 if the substrate 6 includes a semiconductor substrate. Alternatively or additionally, the second select transistors can be formed prior to, concurrently with, or after formation of the first select transistors (14, 16, 18). Alternatively or additionally, the second select transistors can be formed prior to, or after, formation of the second electrically conductive lines 90. Any method for forming transistors as known in the art can be employed to provide the second select transistors. A switched node (e.g., a source region or a drain region) of each second select transistor can be connected to an end of a respective first electrically conductive line 30, and another node (e.g., a drain region or a source region) can be connected to a voltage source (or current source) which provides a node activation voltage V_a.

In one embodiment, each global bit line 10 laterally extends along the second horizontal direction hd2, and two or more of the first selector transistors (14, 16, 18) can be electrically connected to the global bit line 10. The first select transistors (14, 16, 18) are configured to activate a selected second electrically conductive line 90 by supplying an activation voltage thereto from a respective global bit line 10, and the second select transistors (T1-T4) are configured to activate a selected first electrically conductive line 30 by supplying another activation voltage thereto. In one embodiment, the exemplary structure can include a monolithic three-dimensional memory device comprises a resistive random access memory (ReRAM) device.

The exemplary structure of FIGS. 5A-5C can include a monolithic three-dimensional memory device. The monolithic three-dimensional memory device can include a plurality of alternating stacks of insulator lines 60 and first electrically conductive lines 30 located over a substrate 6, wherein each of the insulator lines 60 and the first electrically conductive lines 30 extends along a first horizontal direction hd1, and the alternating stacks (30, 60) are laterally spaced from one another along a second horizontal direction hd2. The monolithic three-dimensional memory device can include vertically spaced sets of metal oxide lines 82. Each metal oxide line 82 can be self-aligned to a sidewall of a respective first electrically conductive line 30, and not physically contact any other of the metal oxide lines 82. The monolithic three-dimensional memory device can include a plurality of second electrically conductive lines 90 extending vertically and contacting one or more vertically spaced sets of metal oxide lines 82. In one embodiment, the vertically spaced sets of metal oxide lines 82 can be non-volatile memory elements providing different resistance depending on a density (such as presence or absence) of conductive filaments 81 therein.

In one embodiment, each of the metal oxide lines 82 contacts only one first electrically conductive line 30 among the first electrically conductive lines 30. However, each of the metal oxide lines 82 preferably contacts plural second electrically conductive lines 90. In one embodiment, the plurality of second electrically conductive lines 90 contacts sidewalls of the insulator lines 60. In one embodiment, the first electrically conductive lines 30 comprise a first electrically conductive material, and the second electrically conductive lines 90 comprise a second electrically conductive material that is different from the first electrically conductive material.

In one embodiment, the first electrically conductive material is a conductive metal nitride, and the second electrically conductive material has a work function greater than 4.5 eV. In one embodiment, the first electrically conductive material is selected from titanium nitride, tantalum nitride, titanium oxynitride in which a ratio of oxygen atoms to nitrogen atoms is less than 0.1, and tantalum oxynitride in which a ratio of oxygen atoms to nitrogen atoms is less than 0.1, and the second electrically conductive material is selected from TaCN, TiCN, Ru, $RuO_2$, Pt, $TiO_x$ with x in a range from 0 to 0.1, TiAlN, TaAlN, TiSiN, TaSiN, $IrO_2$, and doped polysilicon.

In one embodiment, the first select transistors (14, 16, 18) can be vertical transistors having channel regions 14C underlying a respective second electrically conductive line 90. The second electrically conductive lines 90 can be local bit lines. Two or more of the first selector transistors (14, 16, 18) can be electrically connected to a common global bit line 10.

In one embodiment, each vertically spaced set of metal oxide lines 82 can include the same number of metal oxide lines 82 as a total number of first electrically conductive lines 30 within each alternating stack (30, 60). In one embodiment, each second electrically conductive line 90 can be a generally pillar-shaped structure having a width modulation as a function of a distance from the substrate 6, wherein the width modulation comprises a reduction of a width of each second electrically conductive line 90 at levels of the metal oxide lines 82. In one embodiment, the second electrically conductive lines 90 can be in a two-dimensional array in which the second electrically conductive lines 90 are spaced from one another by dielectric material pillars 96 along the first horizontal direction hd1, and by the alternating stacks along the second horizontal direction hd2.

The devices and methods of the present disclosure provide several advantages over prior art resistive memory devices. In one aspect, a continuous metal oxide layer is not formed over the layer stack rail structures (30, 60, 62) of the present disclosure. Accordingly, an anisotropic etch for removing horizontal portions of a metal oxide layer is not necessary during manufacture of the devices of the present disclosure. Collateral damage due to an anisotropic etch process can be avoided during the manufacture of the devices of the present disclosure. This, elimination of collateral damage (i.e., plasma damage during an anisotropic etch process) to the metal oxide lines 82 can improve cycling properties (i.e., reliability) of the ReRAM device of the present disclosure.

In another aspect, the metal oxide lines 82 of the present disclosure are formed with corner regions CR (see FIG. 6) at which the magnitude of the electrical field can provide local maximums. As a consequence, locations of formation of conductive filaments 81 can be limited to the corner regions CR. This feature can reduce the threshold voltage for formation of conductive filaments 81, i.e., the programming voltage for encoding a low resistance state in a memory element of a memory cell (which is a portion of a metal oxide line 82 adjoined by a pair of a first electrically conductive line 30 and a second electrically conductive line 90). In addition, the programming current for encoding the low resistance state in a memory element 82 in each cell is also reduced compared to prior art resistive memory devices.

In prior art resistive memory devices, a conductive filament can be formed at any location of a reversibly resistance-switching material positioned adjacent to a second electrode. Thus, variations in lengths and shapes of conductive filaments occur randomly across the interface between the second electrode and the reversibly resistance-changing material. In contrast, the presence of the corner regions CR in the devices of the present disclosure limits the locations of formation of conductive filaments within the corner regions CR, at which the magnitude of electric field has a local maximum. Accordingly, the lengths and shapes of the conductive filaments formed in the metal oxide lines 82 of the present disclosure can be uniform among various memory cells, and the programming current and the programming voltage of the resistive memory devices of the present disclosure can be reduced and be more uniform relative to prior art resistive memory devices.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device, comprising:
    a plurality of alternating stacks of insulator lines and first electrically conductive lines located over a substrate, wherein each of the insulator lines and the first electrically conductive lines extends along a first horizontal direction, and the alternating stacks are laterally spaced from one another along a second horizontal direction;
    vertically spaced sets of metal oxide lines, each metal oxide line being self-aligned to a sidewall of a respective first electrically conductive line and not physically contacting any other of the metal oxide lines; and
    a plurality of second electrically conductive lines extending vertically and contacting one or more vertically spaced sets of metal oxide lines
    wherein each metal oxide line includes:
        a first vertical sidewall contacting a vertical sidewall of a respective one of the first electrically conductive lines, a lower portion of a vertical sidewall of an insulator line overlying the respective one of the first electrically conductive lines, and an upper portion of a vertical sidewall of another insulator line underlying the respective one of the first electrically conductive lines; and
        a second vertical sidewall that is parallel to the first vertical sidewall and laterally spaced from the first vertical sidewall;
    wherein each of the plurality of second electrically conductive lines has a lesser width along the second horizontal direction at levels of the first electrically conductive lines than at levels of the insulator lines;
    wherein each of the plurality of second electrically conductive lines has a maximum width along the second horizontal direction at a level of one of the insulator lines, and has a minimum width along the second horizontal direction at a level of one of the first electrically conductive lines; and
    wherein each metal oxide line has a first width, and a difference between the maximum width and the minimum width for each of the plurality of second electrically conductive lines is twice the first width of the metal oxide lines.

2. The monolithic three-dimensional memory device of claim 1, wherein the vertically spaced sets of metal oxide lines are non-volatile memory elements providing different resistance depending on a density of conductive filaments therein.

3. The monolithic three-dimensional memory device of claim 1, wherein each of the metal oxide lines contacts only one first electrically conductive line among the first electrically conductive lines and contacts plural second electrically conductive lines.

4. The monolithic three-dimensional memory device of claim 1, wherein:
    the first electrically conductive lines comprise a first electrically conductive material; and
    the second electrically conductive lines comprise a second electrically conductive material that is different from and has a higher work function than the first electrically conductive material.

5. The monolithic three-dimensional memory device of claim 4, wherein:
    the metal oxide lines comprise hafnium oxide;
    the first electrically conductive material is selected from titanium nitride, tantalum nitride, titanium oxynitride in which a ratio of oxygen atoms to nitrogen atoms is less than 0.1, and tantalum oxynitride in which a ratio of oxygen atoms to nitrogen atoms is less than 0.1; and
    the second electrically conductive material is selected from TaCN, TiCN, Ru, $RuO_2$, Pt, $TiO_x$ with x in a range from 0 to 0.1, TiAlN, TaAlN, TiSiN, TaSiN, $IrO_2$, and doped polysilicon.

6. The monolithic three-dimensional memory device of claim 4, wherein:
    the metal oxide lines comprise an oxide of Hf, Ti, Zr, Al or Ta;
    the first electrically conductive material is a conductive metal nitride;
    the second electrically conductive material has a work function greater than 4.5 eV; and
    the monolithic three-dimensional memory device comprises a resistive random access memory (ReRAM) device.

7. The monolithic three-dimensional memory device of claim 1, further comprising first and second selector transistors, wherein:
    a switched node of each first select transistor is connected to an end of a respective second electrically conductive line;

the first select transistors are configured to activate a selected second electrically conductive line by supplying an activation voltage thereto;

a switched node of each second select transistors is connected to an end of a respective first electrically conductive line; and the second select transistors are configured to activate a selected first electrically conductive line by supplying another activation voltage thereto.

8. The monolithic three-dimensional memory device of claim 7, wherein:

the first select transistors are vertical transistors having channel regions underlying a respective second electrically conductive line;

the first electrically conductive lines comprise word lines;

the second electrically conductive lines comprise local bit lines; and two or more of the second selector transistors are electrically connected to a common global bit line.

9. The monolithic three-dimensional memory device of claim 1, wherein each vertically spaced set of metal oxide lines includes a same number of metal oxide lines as a total number of first electrically conductive lines within each alternating stack.

10. The monolithic three-dimensional memory device of claim 1, wherein:

each second electrically conductive line is a generally pillar-shaped structure having a width modulation as a function of a distance from the substrate, wherein the width modulation comprises a reduction of a width of each second electrically conductive line at levels of the metal oxide lines; and the second electrically conductive lines are in a two-dimensional array in which the second electrically conductive lines are spaced from one another by dielectric material pillars along the first horizontal direction, and by the alternating stacks along the second horizontal direction.

11. The monolithic three-dimensional memory device of claim 1, wherein the vertical sidewall of the respective one of the first electrically conductive lines, the lower portion of the vertical sidewall of the insulator line overlying the respective one of the first electrically conductive lines, and the upper portion of a vertical sidewall of another insulator line underlying the respective one of the first electrically conductive lines are within a same vertical plane.

12. The monolithic three-dimensional memory device of claim 11, wherein each metal oxide line further includes:

an upper corner region including an upper curved surface that adjoins an upper edge of the first vertical sidewall and an upper edge of the second vertical sidewall and providing a location at which a magnitude of electrical field is at a local maximum upon application of electrical bias thereacross; and a lower corner region including an upper curved surface that adjoins a lower edge of the first vertical sidewall and a lower edge of the second vertical sidewall and providing another location at which a magnitude of electrical field is at a local maximum upon application of electrical bias thereacross.

13. The monolithic three-dimensional memory device of claim 12, wherein the second vertical sidewall of each metal oxide line, the upper curved surface of each metal oxide line, and the lower curved surface of each metal oxide line contact a respective one of the plurality of second electrically conductive lines.

14. The monolithic three-dimensional memory device of claim 1, wherein each interface between any of the plurality of second electrically conductive lines and any of the respective metal oxide lines comprises a combination of a vertical surface and two curved surfaces.

15. The monolithic three-dimensional memory device of claim 1, wherein an entirety of an interface between each metal oxide line and the plurality of alternating stacks consists of areas at which the first vertical sidewall contacts the vertical sidewall of the respective one of the first electrically conductive lines, the lower portion of the vertical sidewall of an insulator line overlying the respective one of the first electrically conductive lines, and the upper portion of the vertical sidewall of another insulator line underlying the respective one of the first electrically conductive lines.

16. The monolithic three-dimensional memory device of claim 1, wherein an entirety of the second vertical sidewall is in direct contact with a respective one of the plurality of second electrically conductive lines.

* * * * *